(12) United States Patent
Takagi

(10) Patent No.: US 11,252,804 B2
(45) Date of Patent: Feb. 15, 2022

(54) OLED DRIVE DEVICE

(71) Applicant: CCS Inc., Kyoto (JP)

(72) Inventor: Hidekazu Takagi, Kashihara (JP)

(73) Assignee: CCS INC., Kyoto (JP)

( * ) Notice: Subject to any disclaimer, the term of this patent is extended or adjusted under 35 U.S.C. 154(b) by 0 days.

(21) Appl. No.: 17/286,695

(22) PCT Filed: Oct. 23, 2019

(86) PCT No.: PCT/JP2019/041499
§ 371 (c)(1),
(2) Date: Apr. 19, 2021

(87) PCT Pub. No.: WO2020/085370
PCT Pub. Date: Apr. 30, 2020

(65) Prior Publication Data
US 2021/0345467 A1  Nov. 4, 2021

(30) Foreign Application Priority Data

Oct. 26, 2018  (JP) .............................. JP2018-201448

(51) Int. Cl.
| H05B 45/325 | (2020.01) |
| G09G 3/32 | (2016.01) |
| H01L 51/50 | (2006.01) |
| H05B 45/00 | (2022.01) |

(52) U.S. Cl.
CPC ........... H05B 45/60 (2020.01); H05B 45/325 (2020.01)

(58) Field of Classification Search
CPC ...... H05B 45/30; H05B 45/325; H05B 45/60; H01L 51/50; G09G 3/32; G09G 3/3208
See application file for complete search history.

(56) References Cited

U.S. PATENT DOCUMENTS

| 10,390,403 B2* | 8/2019 | Tanaka .................... H05B 33/06 |
| 2010/0244704 A1* | 9/2010 | Takaki .................... H05B 45/60 |
| | | 315/127 |
| 2018/0122300 A1* | 5/2018 | Jang ....................... G09G 3/3258 |
| 2018/0242413 A1* | 8/2018 | Hue .................... H05B 45/3725 |

FOREIGN PATENT DOCUMENTS

| JP | 2006235891 A | 9/2006 |
| JP | 2011233437 A | 11/2011 |
| JP | 2012021889 A | 2/2012 |
| JP | 2018017631 A | 2/2018 |
| WO | 2009041437 A1 | 4/2009 |

* cited by examiner

*Primary Examiner* — Thai Pham
(74) *Attorney, Agent, or Firm* — Alleman Hall Creasman & Tuttle LLP

(57) ABSTRACT

An OLED driving device includes an overdrive controller (ODC) which executes an overdrive of applying to an OLED an electric current larger than a rated electric current for the OLED for a predetermined period (period for the overdrive) to cause the OLED to emit brighter light for the predetermined period than at the rated electric current for the OLED for light emitting. The controller (ODC) executes a PWM control to the electric current flowing to the OLED for the predetermined period, and sets a PWM signal in the predetermined period so that at least one pulse of a pulse before the OLED starts the light emitting and a pulse at a just time when the OLED starts the light emitting has a width larger than a width of a pulse after the OLED starts the light emitting.

3 Claims, 6 Drawing Sheets

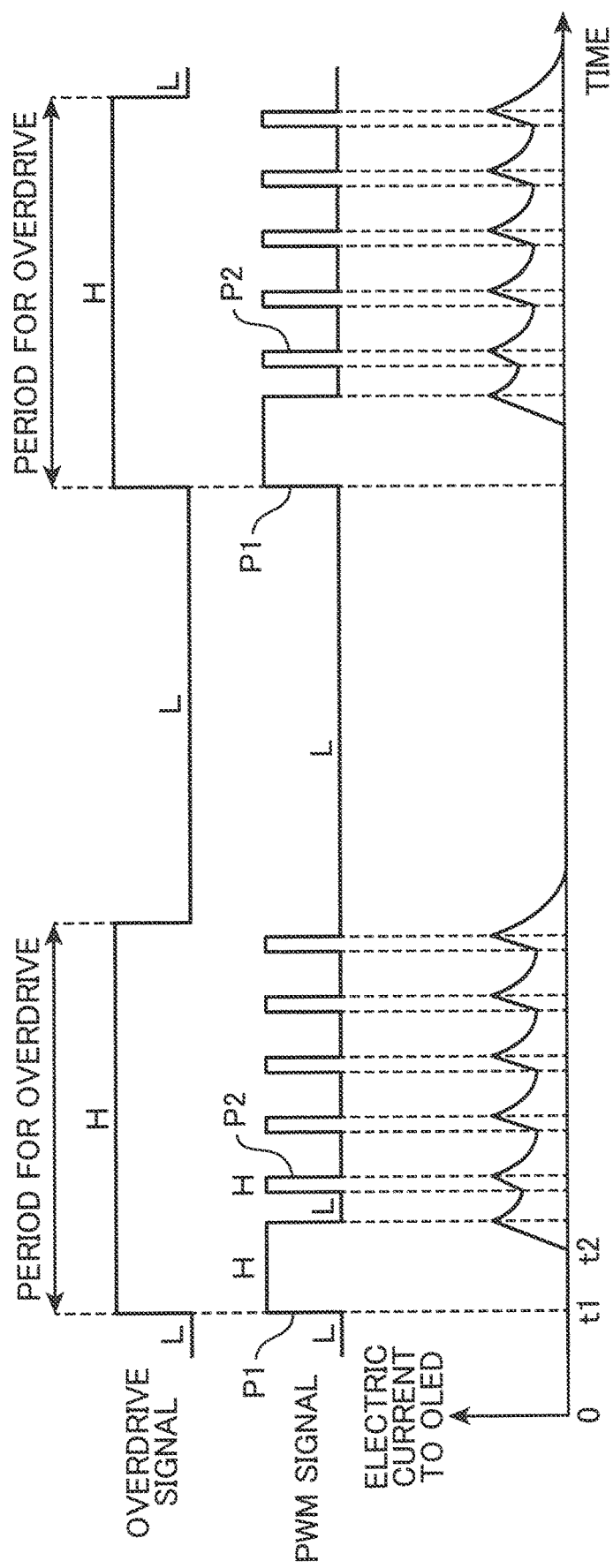

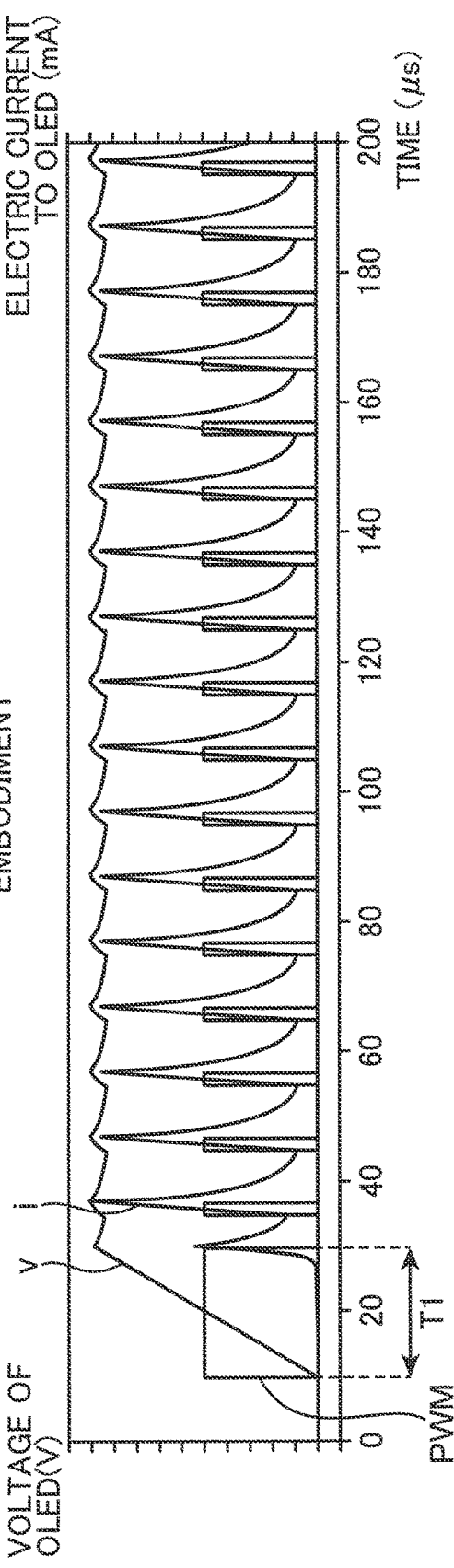
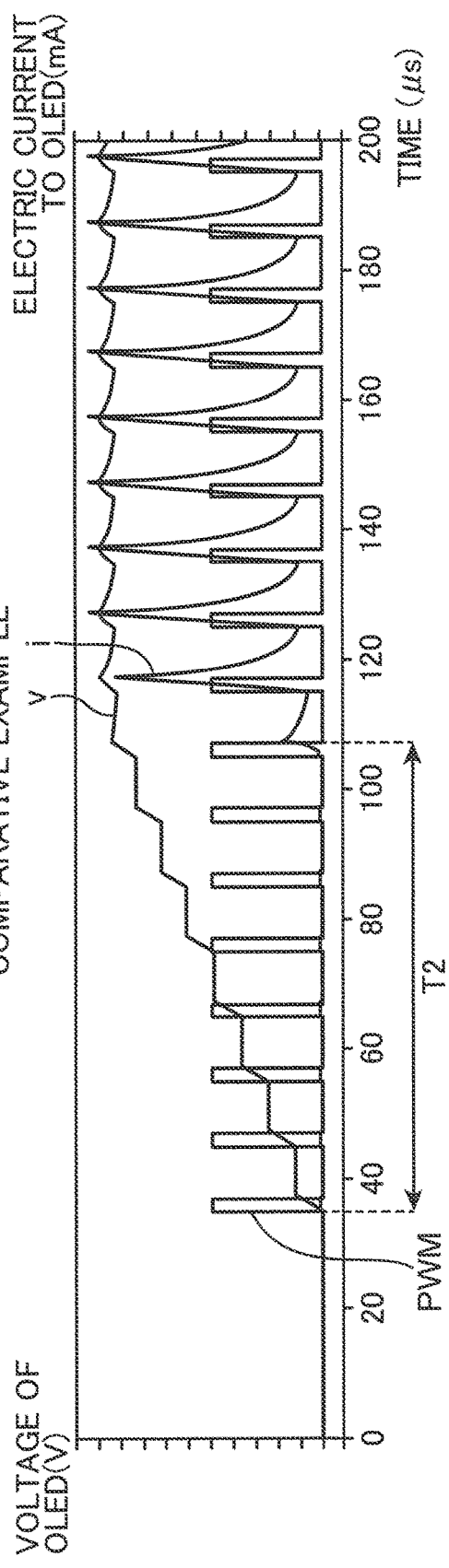

OLED DRIVE DEVICE

TECHNICAL FIELD

The present invention relates to an OLED driving device for driving an OLED for use in inspection OLED lighting.

BACKGROUND ART

Light emitting diode (LED) lighting and organic light emitting diode (OLED) lighting are adaptable to inspection lighting for inspecting products. The products include, for example: semiconductors; electronic and electric components; flat panel detectors (FPDs) and the relevant products; transportation goods, and robots; iron and metal components; sheets, films, and glass; automobiles; products made of rubber, resin, and plastic; foods; chemicals; containers; packages; and medical equipment. For instance, the LED lighting or the OLED lighting is adopted for inspecting these products by employing a machine vision.

The inspection LED lighting has been more practically used than the inspection OLED lighting. For instance, LED driving devices each for executing an operative overdrive have been already practically adopted.

The overdrive represents a control of applying to an LED an electric current larger than a rated electric current (rated electric current value). The overdrive enables brighter lighting. The rated electric current represents an electric current value guaranteed by a manufacturer of a lighting panel (here, LED panel) for a stable use of the lighting panel. A period for the overdrive is restricted to be short (e.g., 1 µs to 1000 µs) to prevent a damage to the LED and an accelerated deterioration of the LED.

For instance, the technology concerning the inspection LED lighting includes a lighting control power source disclosed in Patent Literature 1. The lighting control power source executes a control of a repetitive sequence of light emitting from the LED and suspending of the light emitting therefrom, and realizes the light emitting suitable for light modulation in the control by adjusting a ratio between a time of the light emitting and a time of the suspending.

The present inventor has studied for a practical use of the technology of executing an overdrive to an OLED under a pulse width modulation (PWM) form. This technology contributes to the light modulation for the OLED by executing a PWM control to an electric current flowing to the OLED in the overdrive. As a result of the study, the inventor has encountered the problems to be described below.

For the purpose of causing the OLED to execute light emitting (an emission of light), the OLED needs a voltage exceeding a threshold which allows the OLED to execute the light emitting. Under the PWM control, the OLED cannot have the voltage exceeding the threshold without a load charged to a parasitic capacitance of the OLED. The OLED emits light on a plane basis, and thus has a relatively large parasitic capacitance. It takes a longer time to charge the load as the parasitic capacitance is larger. Here, the OLED has the relatively large parasitic capacitance, and hence it takes a long time to charge the load thereto. This causes a delay in a start of the light emitting (start of the emission of light) from the OLED. In employing the machine vision, there is a case where a large number of inspection targets are inspected at a high speed. In this case, the inspection targets pass through an image taking area of the camera at the high speed. Accordingly, a corresponding high speed is set for releasing a shutter of the camera. A significant delay in a start of the light emitting from the OLED subjected to the overdrive under the PWM form causes a large difference between a time when the OLED starts the light emitting and a time when the shutter of the camera is released. This difference makes it difficult to adapt the lighting to lighting employing the machine vision.

The brightness of the OLED is variable owing to the light modulation. An amount of the electric current flowing to the OLED becomes smaller as the brightness of light from the OLED decreases. Hence, the time required to charge the load to the parasitic capacitance of the OLED takes longer. This consequently causes a significant delay in a start of the light emitting from the OLED in accordance with the decrease in the brightness of light from the OLED. To avoid such a delay, it is necessary to change the time when the shutter of the camera is released in accordance with the brightness of light from the OLED in adopting the OLED subjected to the overdrive under the PWM form for the lighting employing the machine vision.

CITATION LIST

Patent Literature

Patent Literature 1: Japanese Unexamined Patent Publication No. 2018-17631

SUMMARY OF INVENTION

An object of the present invention is to provide an OLED driving device which can reduce a delay in a start of light emitting from the OLED when the OLED is subjected to an overdrive under a PWM form.

An OLED driving device according to the present invention includes a controller for executing an overdrive to cause an OLED to emit bright light. The controller sets a PWM signal so that at least one pulse of a pulse before the OLED starts light emitting and a pulse at a just time when the OLED starts the light emitting has a width larger than a width of a pulse after the OLED starts the light emitting.

The object, features, and advantages of the present invention will be further clarified by the following detailed description and the accompanying drawings.

BRIEF DESCRIPTION OF DRAWINGS

FIG. 5 is a time chart showing a relation among the overdrive signal, the PWM signal, and an electric current to the OLED.

FIG. 6 shows a comparison view including a simulation graph in the embodiment and a simulation graph in a comparative example.

DESCRIPTION OF EMBODIMENTS

Figure 1:
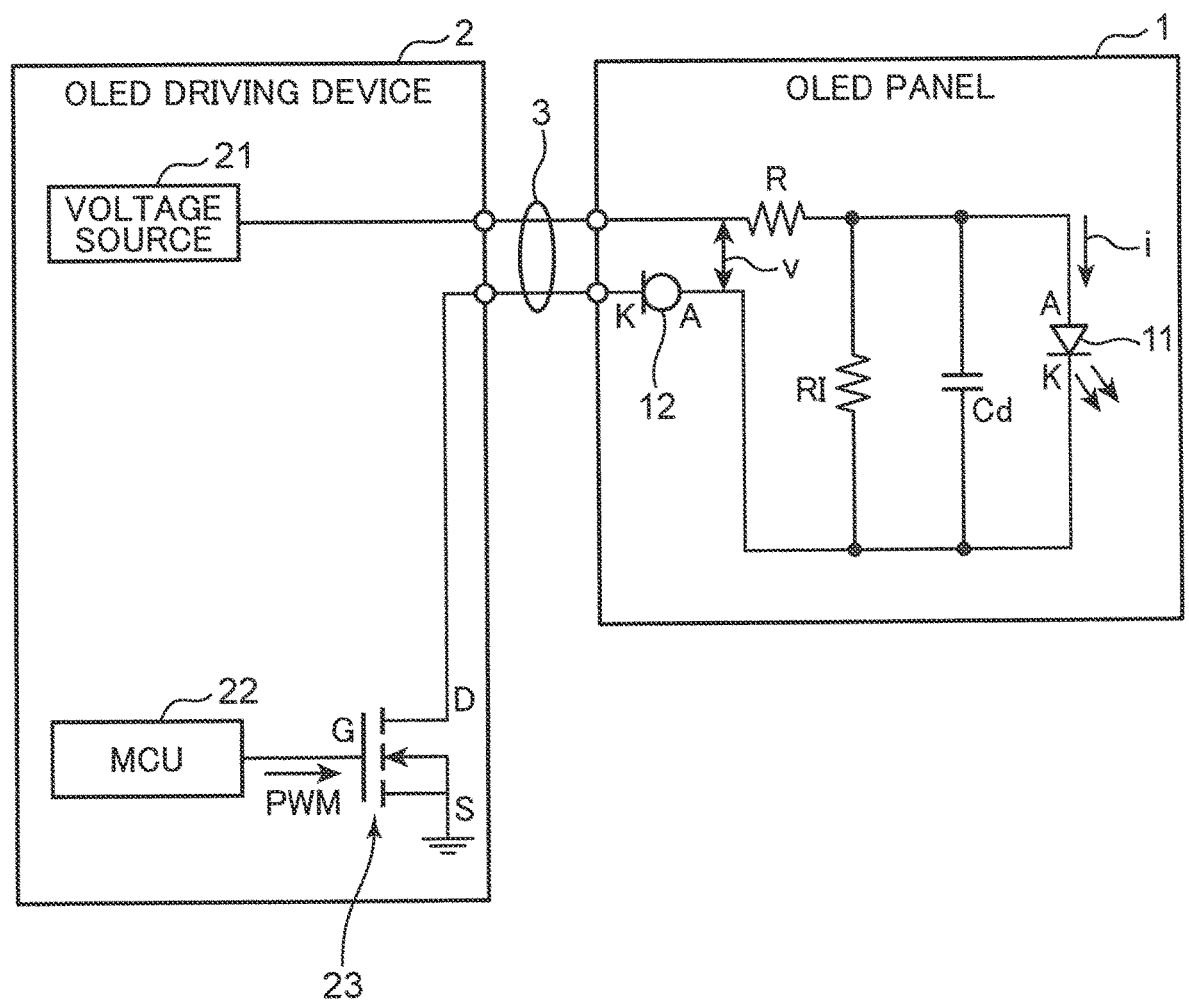
FIG. 1 is an equivalent circuit diagram of an OLED lighting system in an embodiment.

Hereinafter, one or more embodiments of the present invention will be described with reference to the accompanying drawings. Elements denoted by the same reference numerals in the drawings have the same configuration and, therefore, repeated descriptions will be appropriately omitted.

FIG. 1 is an equivalent circuit diagram of an OLED lighting system 100 in an embodiment. The OLED lighting system 100 is used for inspection lighting, and includes an OLED panel 1, an OLED driving device 2, and a cable 3. The OLED panel 1 and the OLED driving device 2 are independent of each other and connected to each other via the cable 3.

The OLED panel 1 includes an OLED 11 and a current regulative diode 12. The OLED 11 includes a single OLED element or a plurality of OLED elements connected in series for emitting light on a plane basis. The sign "Cd" denotes a parasitic capacitance of the OLED 11. The sign "RI" denotes an impedance attributed to a leaked electric current. The sign "R" denotes a total resistance including a resistance of wires (including the cable 3, wires in the OLED panel 1, and wires in the OLED driving device 2) connected to the OLED 11, a resistance at an anode of the OLED 11, and a resistance at a cathode of the OLED 11.

When the OLED 11 has a voltage v exceeding a threshold for causing the OLED 11 to emit light, an electric current i starts flowing to the OLED 11 to cause the OLED 11 to start the light emitting.

An anode of the current regulative diode 12 and the cathode of the OLED 11 are connected to each other. The current regulative diode 12 is an element for applying a constant current to the OLED 11. A constant current circuit may be adopted in place of the current regulative diode 12.

The OLED driving device 2 includes a voltage source 21, a micro controller unit (MCU) 22, and a switching element 23 for driving the OLED 11.

The voltage source 21 includes, for example, an AC-DC converter or a DC-DC converter connected to the anode of the OLED 11 via the cable 3. The voltage source 21 applies a positive voltage to the anode of the OLED 11. The positive voltage is larger than a sum of the voltage v of the OLED 11 and a voltage required to drive the current regulative diode 12.

The MCU 22 generates the PWM signal for light modulation for the OLED 11. The OLED 11 is subjected to the light modulation under the PWM form. Here, a programmable logic device (PLD) may be adopted in place of the MCU 22.

The switching element 23 is on or off in response to the PWM signal output from the MCU 22. The switching element 23 includes, for example, an N-channel power metal oxide semiconductor field effect transistor (MOSFET). The switching element 23 includes a first electrode, a second electrode, and a third electrode. The first electrode (a gate electrode of the N-channel power MOSFET) receives an input of the PWM signal output from the MCU 22. The second electrode (a drain electrode of the N-channel power MOSFET) is connected to a cathode of the current regulative diode 12 via the cable 3. The third electrode (a source electrode of the N-channel power MOSFET) is connected to the ground.

The current regulative diode 12 is at a position closer to the cathode of the OLED panel 1, but may be at a position closer to the anode of the OLED panel 1. The current regulative diode 12 is arranged in the OLED panel 1, but may be arranged at the cable 3, or may be arranged in the OLED driving device 2.

The current regulative diode 12 allows a constant current to flow to the OLED 11 at a rated electric current for the OLED 11 or larger when the OLED is subjected to the overdrive. A PWM control is executed to the constant current flowing to the OLED 11 so that the constant current reaches the rated electric current or smaller.

Figure 2:
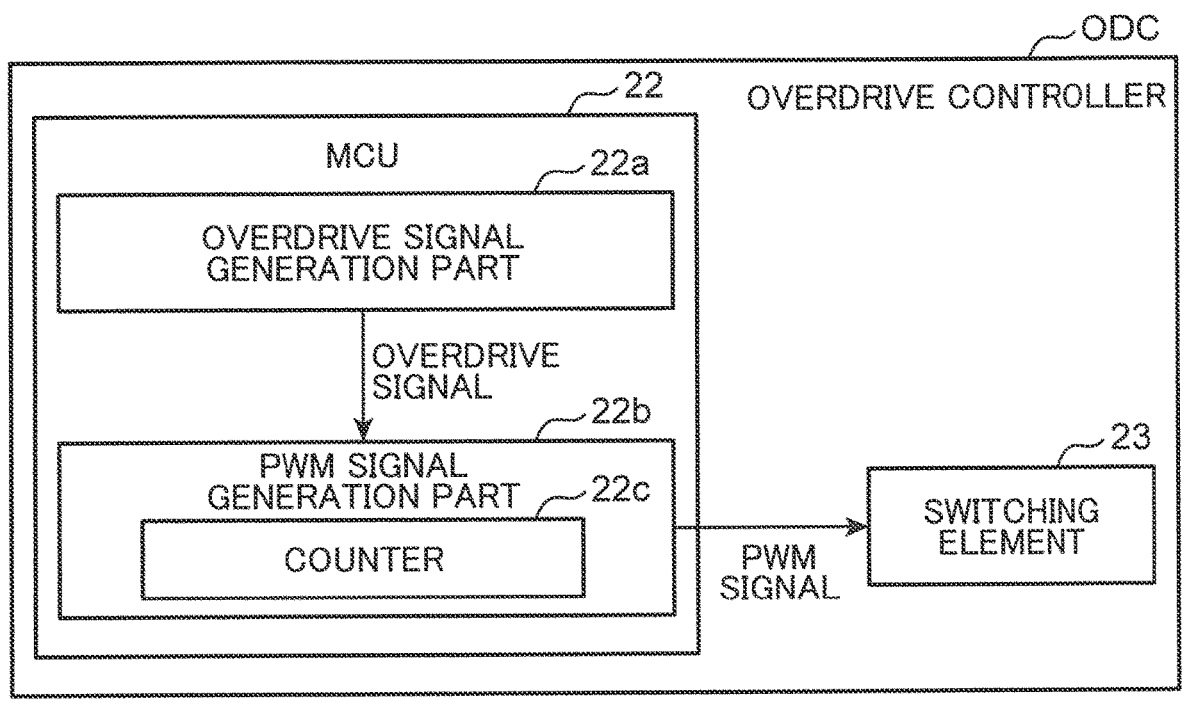
FIG. 2 is an operative block diagram of an overdrive controller included in an OLED driving device.
Figure 3:
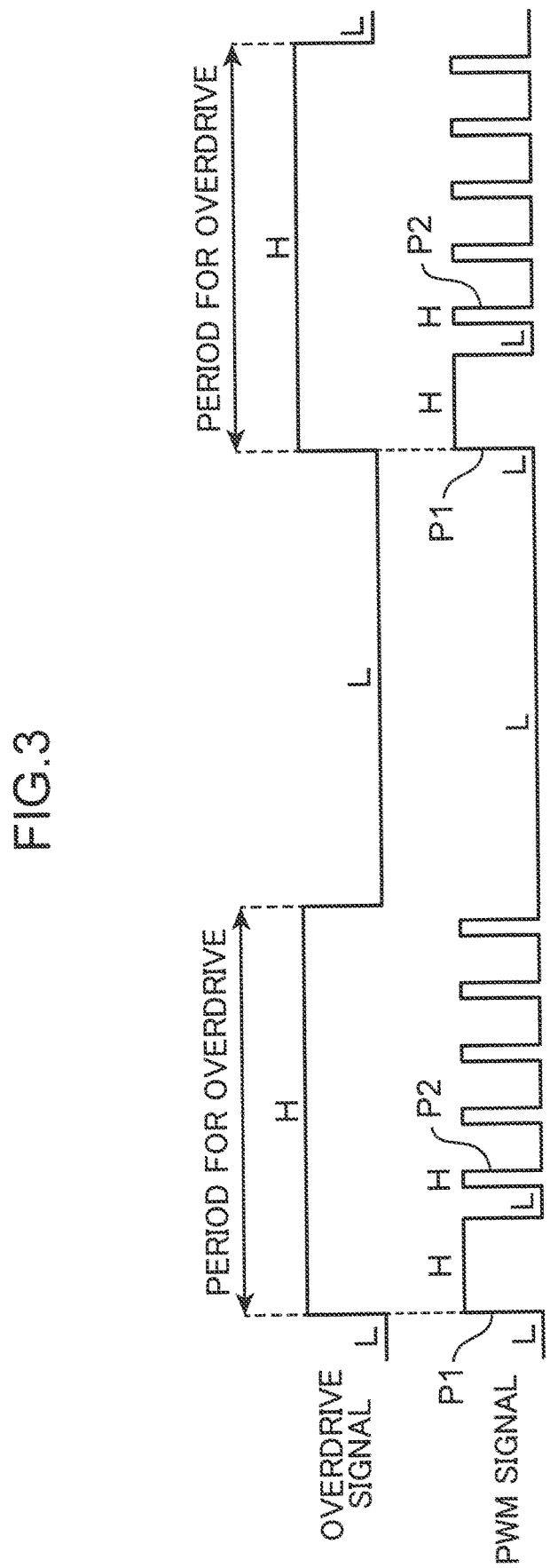
FIG. 3 is a time chart showing a relation between an overdrive signal and a PWM signal generated in the overdrive controller.

FIG. 2 is an operative block diagram of an overdrive controller ODC included in the OLED driving device 2. FIG. 3 is a time chart showing a relation between an overdrive signal and a PWM signal generated in the overdrive controller ODC. The overdrive controller ODC executes the overdrive to the OLED 11, and light modulation for the OLED 11 under the PWM form. The overdrive is aimed at applying to the OLED 11 an electric current larger than the rated electric current for the OLED 11 for a predetermined period to cause the OLED 11 to emit brighter light for the predetermined period than at the rated electric current for the OLED for light emitting. The predetermined period is defined as a period for the overdrive.

Referring to FIG. 2 and FIG. 3, the overdrive controller ODC includes an overdrive signal generation part 22a, a PWM signal generation part 22b, and the switching element 23. The MCU 22 establishes the overdrive signal generation part 22a and the PWM signal generation part 22b.

The overdrive signal generation part 22a generates an overdrive signal. The overdrive signal shows alternate L-levels and H-levels for execution of repeated overdrives. A period at one H-level represents a period (predetermined period) for each overdrive.

The PWM signal generation part 22b generates a PWM signal in the period for the overdrive. The PWM signal is input to the switching element 23 to make the switching element 23 be on or off. The switching element 23 is on at an H-level of the PWM signal, and the electric current flows in a circuit defined by the voltage source 21, the OLED 11, the current regulative diode 12, and the switching element 23 shown in FIG. 1. The switching element 23 is off at an L-level of the PWM signal to keep the electric current from flowing in the circuit.

Figure 4:
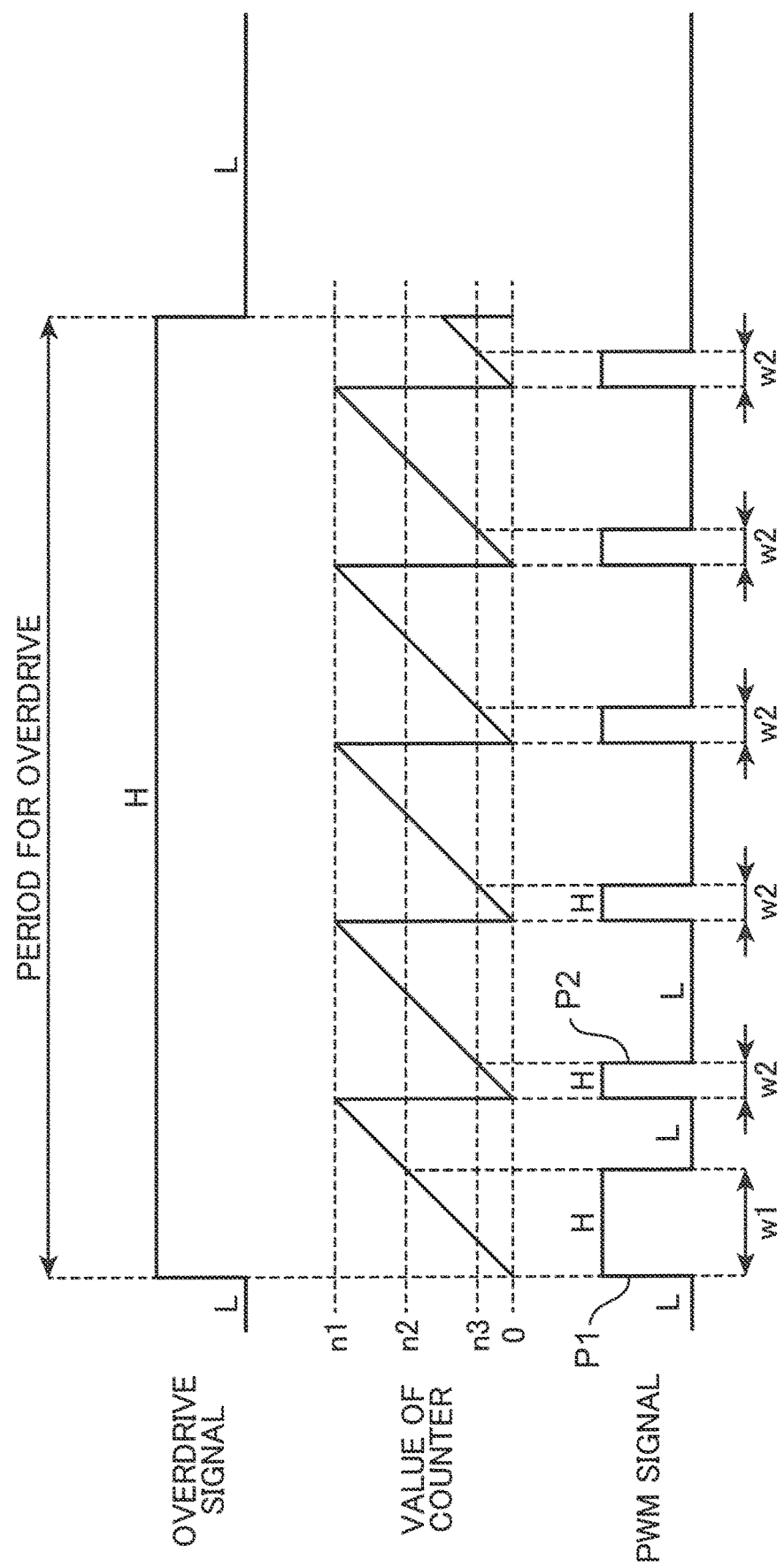
FIG. 4 is a time chart explaining an exemplary way of generating the PWM signal.

FIG. 4 is a time chart explaining an exemplary way of generating the PWM signal. Referring to FIG. 2 and FIG. 4, the PWM signal generation part 22b includes a counter 22c. The counter 22c counts from 0 to a first number n1, restores a counted value to 0, and recounts from 0 to the first number n1. The counter 22c starts counting when the overdrive signal reaches the H-level from the L-level. The counter 22c finishes counting when the overdrive signal reaches the L-level from the H-level.

The PWM signal generation part 22b changes the level of the PWM signal from the L-level to the H-level when the counter 22c starts counting. The PWM signal generation part 22b changes the level of the PWM signal from the H-level to the L-level when the counter 22c counts from 0 to a second number n2 (n2<n1). Consequently, a first pulse P1 is generated. The first pulse P1 has a width w1 corresponding to a time required for the counter 22c to count from 0 to the second number n2.

When the counter 22c counts from 0 to the first number n1, the counter 22c restores the counted value to 0 and the PWM signal generation part 22b changes the level of the PWM signal from the L-level to the H-level. When the counter 22c counts from 0 to a third number n3 (n3<n2), the PWM signal generation part 22b changes the level of the PWM signal from the-H-level to the L-level. Consequently, a second pulse P2 is generated. The second pulse P2 has a width w2 corresponding to a time required for the counter 22c to count from 0 to the third number n3. Subsequent pulses are also generated in the same manner as the second pulse P2. Accordingly, each of the subsequent pulses has the width w2 equal to the width of the second pulse P2.

The overdrive controller ODC executes the PWM control to the electric current flowing to the OLED 11 for the period for the overdrive, and sets the PWM signal in the period for the overdrive so that the width (=w1) of the first pulse P1 is larger than the width (=w2) of the second and subsequent pulses.

FIG. 5 is a time chart showing a relation among the overdrive signal, the PWM signal, and the electric current i to the OLED 11. The PWM signal is generated in the period (predetermined period) for each overdrive. Referring to FIG. 1 and FIG. 5, the electric current i starts flowing to the OLED 11 at the first pulse P1 of the PWM signal. Hence, the first pulse P1 represents a pulse at a just time when the OLED 11 starts the light emitting. Further, each of the second and subsequent pulses represents a pulse after the OLED 11 starts the light emitting.

The period for the overdrive starts at a time t1 when the level of the overdrive signal changes from the L-level to the H-level. The electric current i starts flowing to the OLED 11 at a time t2 in a delay from the time t1. In other words, there is a delay in the start of the light emitting from the OLED 11. This is because it takes a long time to charge a load to the parasitic capacitance Cd of the OLED 11.

In the embodiment, a successful reduction in the delay in the start of the light emitting from the OLED 11 will be described. As shown in FIG. 4, the PWM signal in the embodiment is set so that the width (=w1) of the first pulse P1 is larger than the width (=w2) of the second and subsequent pulses thereof. In a comparative example, a PWM signal is set so that all the pulses have a width w2. FIG. 6 shows a comparison view including a simulation graph in the embodiment and a simulation graph in the comparative example. A horizontal axis in each of the graphs represents a time. A left vertical axis in each of the graphs represents the voltage v of the OLED 11. A right vertical axis in each of the graphs represents the electric current i to the OLED 11.

Referring to FIG. 1 and FIG. 6, the voltage v of the OLED 11 exceeds the threshold for causing the OLED 11 to emit light at the first pulse P1 of the PWM signal in the embodiment. This means that the load is charged to the parasitic capacitance Cd of the OLED 11. Accordingly, the electric current i starts flowing to the OLED 11 at the first pulse P1 to allow the OLED 11 to start the light emitting. The first pulse P1 represents a pulse at a just time when the OLED 11 starts the light emitting. Each of the second and subsequent pulses represents a pulse after the OLED 11 starts the light emitting. A delay time T1 (delay amount) represents a difference between a time when the period (predetermined period) for the overdrive starts and the just time when the OLED 11 starts the light emitting.

In the comparative example, the OLED 11 has a voltage v exceeding a threshold for causing an OLED 11 to emit light at an eighth pulse of a PWM signal. Accordingly, an electric current i starts flowing to the OLED 11 to allow the OLED 11 to start the light emitting at the eighth pulse. A delay time T2 (delay amount) represents a difference between a time when a period (predetermined period) for the overdrive starts and a time when the OLED 11 starts the light emitting.

The delay time T1 in the embodiment is shorter than the delay time T2 in the comparative example. The reason will be described below. In the embodiment, the width of the first pulse P1 (the width of the pulse at the just time when the OLED 11 starts the light emitting) is set to be larger than the width of the second and subsequent pulses (the width of each of the pulses after the OLED starts the light emitting). This setting achieves a reduction in the time required for the voltage v of the OLED 11 to reach a value allowing the OLED 11 to execute the light emitting.

As described above, it is possible to reduce the delay in the start of the light emitting from the OLED 11 by executing the overdrive to the OLED 11 under the PWM form in the embodiment.

Referring to FIG. 4 and FIG. 5, the overdrive controller ODC controls the OLED 11 to start the light emitting at the first pulse P1 of the PWM signal, the width (=w1) of the first pulse P1 being set to be larger than the width (=w2) of the second and subsequent pulses. Accordingly, it is possible to reduce the delay in the start of the light emitting from the OLED 11 in the embodiment in comparison with a configuration where the OLED 11 starts light emitting at a pulse (a second or subsequent pulse) subsequent to the first pulse P1.

At a finish of one overdrive after a lapse of the period for the overdrive, the load having been charged to the parasitic capacitance of the OLED 11 is discharged. Thus, when the width of the first pulse P1 is not larger than a width of a pulse subsequent to the first pulse P1 (i.e., a pulse after the OLED 11 starts the light emitting) in a next overdrive, a delay in a start of light emitting from the OLED 11 cannot be reduced in the next overdrive. In execution of repeated overdrives in the embodiment, the overdrive controller ODC sets the width of the first pulse P1 to be larger than the width of the pulse subsequent to the first pulse P1 (i.e., the pulse after the OLED 11 starts the light emitting) in the period (predetermined period) for each overdrive. Accordingly, a delay in a start of light emitting from OLED 11 can be reduced for each overdrive.

Referring to FIG. 4 and FIG. 5, in the embodiment, the overdrive controller ODC controls the OLED 11 to start the light emitting at the first pulse P1 by setting the width (=w1) of the first pulse P1 of the pulses constituting the PWM signal to be larger than the width (=w2) of the remaining pulses (the second pulse and subsequent pulses) subsequent to the first pulse P1 in the period (predetermined period) for the overdrive. However, the controlling way should not be limited to thereto. The overdrive controller ODC sets a width of at least one pulse of a pulse before the OLED 11 starts the light emitting and a pulse at a just time when the OLED 11 starts the light emitting to be larger than a width of a pulse after the OLED 11 starts the light emitting. Additionally, the overdrive controller ODC may control the OLED 11 to start the light emitting at the second or subsequent pulse.

Summary of Embodiment

An OLED driving device according to one aspect is a device for driving an OLED for use in inspection OLED lighting. The OLED driving device includes a controller which executes an overdrive of applying to the OLED an electric current larger than a rated electric current for the OLED for a predetermined period to cause the OLED to emit brighter light for the predetermined period than at the rated electric current for the OLED for light emitting. The controller executes a PWM control to the electric current flowing to the OLED for the predetermined period, and sets a PWM signal in the predetermined period so that at least one pulse of a pulse before the OLED starts the light emitting and a pulse at a just time when the OLED starts the light emitting has a width larger than a width of a pulse after the OLED starts the light emitting.

Hereinafter, the pulse before the OLED starts the light emitting, the pulse at the just time when the OLED starts the light emitting, and the pulse after the OLED starts the light emitting will be described. When the OLED starts the light emitting at an n-th pulse of the PWM signal, the pulse before the OLED starts the light emitting indicates a pulse preceding the n-th pulse. The pulse at the just time when the OLED starts the light emitting indicates the n-th pulse. The pulse after the OLED starts the light emitting indicates a pulse (n+1-th or subsequent pulse) subsequent to the n-th pulse. In this case, at least one pulse among the first to the n-th pulses is set to have a width larger than a width of the pulse subsequent to the n-th pulse.

A detailed example for this case will be described below. When the OLED starts the light emitting at a first pulse of a PWM signal, no pulse exists before the OLED starts the light emitting. Thus, the pulse at the just time when the OLED starts the light emitting indicates the first pulse. The pulse after the OLED starts the light emitting indicates a pulse (a second or subsequent pulse) subsequent to the first pulse. In this case, the width of the first pulse is set to be larger than the width of the pulse subsequent to the first pulse.

When the OLED starts the light emitting at the second pulse of the PWM signal, the pulse before the OLED starts the light emitting indicates the first pulse. The pulse at the just time when the OLED starts the light emitting indicates the second pulse. The pulse after the OLED starts the light emitting indicates a pulse (a third or subsequent pulse) subsequent to the second pulse. In this case, a width of at least one pulse of the first pulse and the second pulse is set to be larger than a width of the pulse subsequent to the second pulse. The definition of "at least one pulse" can cover a setting that the width of the first pulse is larger than the width of the pulse subsequent to the second pulse. Alternatively, the width of the second pulse may be larger than the width of the pulse subsequent to the second pulse. Further alternatively, the width of each of the first and the second pulses may be larger than the width of the pulse subsequent to the second pulse.

The controller executes the overdrive to the OLED to thereby allow the OLED to emit brighter light than at the rated electric current for the OLED for the light emitting (emission of light). The controller executes the PWM control to the electric current flowing to the OLED for the predetermined period (period for one overdrive) for light modulation for the OLED under the PWM. The controller sets a PWM signal in the predetermined period so that at least one pulse of a pulse before the OLED starts the light emitting and a pulse at a just time when the OLED starts the light emitting has a width larger than a width of a pulse after the OLED starts the light emitting. This setting achieves a reduction in the time required for the voltage of the OLED to exceed a threshold which allows the OLED to execute the light emitting (i.e., time required to charge a load to a parasitic capacitance of the OLED).

From these perspectives, the OLED driving device can reduce a delay in the start of the light emitting from the OLED when the OLED is subjected to the overdrive under the PWM form. This can decrease a difference between a time when the OLED starts the light emitting and a time when a shutter of a camera is released. Consequently, it is possible to adapt the OLED driven by the OLED driving device to the lighting employing the machine vision.

A decrease in the brightness of light from the OLED results in a large delay amount in the start of the light emitting from the OLED. In contrast, the OLED driving device can reduce the delay in the start of the light emitting from OLED. Therefore, the delay amount in the start of the light emitting can be regarded as the same at different brightness of light from the OLED. Under the circumstances, adoption of the OLED driven by the OLED driving device for the lighting employing the machine vision eliminates the necessity of changing the speed of releasing the shutter of the camera in accordance with the brightness of light from the OLED.

In this configuration, the controller controls the OLED to start the light emitting at a first pulse of the PWM signal, a width of the first pulse being set to be larger than a width of second and subsequent pulses of the PWM signal.

In this configuration, the OLED starts the light emitting at the first pulse of the PWM signal. This configuration makes it possible to reduce the delay in the start of the light emitting from the OLED in comparison with a configuration where an OLED starts light emitting at a pulse (a second or subsequent pulse) subsequent to the first pulse.

In this configuration, in execution of repeated overdrives, the controller sets the width of the at least one pulse to be larger than the width of the pulse after the OLED starts the light emitting in the predetermined period for each overdrive.

At a finish of one overdrive after a lapse of the predetermined period, the load having been charged to the parasitic capacitance of the OLED is discharged. Thus, when a width of at least one pulse is not larger than a width of a pulse after the OLED starts the light emitting in a next overdrive, a delay in a start of the light emitting from the OLED cannot be reduced in the next overdrive. In the execution of repeated overdrives in this configuration, the width of the at least one pulse is set to be larger than the width of the pulse after the OLED starts the light emitting for each overdrive. Accordingly, the delay in the start of the light emitting from OLED can be reduced for each overdrive.

This application is based on Japanese Patent Application No. 2018-201448 filed in Japan Patent Office on Oct. 26, 2018, the entire disclosure of which are hereby incorporated by reference.

Although the present invention has been fully described by way of example with reference to the accompanying drawings, it is to be understood that various changes and/or modified embodiments will be apparent to those skilled in the art. Therefore, unless otherwise such changes and modified embodiments to be made by those skilled in the art depart from the scope of the present invention hereinafter defined, they should be construed as being included therein.

INDUSTRIAL APPLICABILITY

The present invention can provide an OLED driving device.

The invention claimed is:

1. An organic light emitting diode (OLED) driving device for driving an OLED and use in inspection of OLED lighting, comprising:
 a controller executes an overdrive to the OLED under a pulse width modulation (PWM) form and applies to the OLED an electric current larger than a rated electric current for the OLED in a predetermined period to cause the OLED to emit a brighter light for the predetermined period than at the rated electric current for the OLED for light emitting, wherein
 the controller executes a PWM control to the electric current flowing to the OLED in the overdrive for the predetermined period, and sets a PWM signal in the predetermined period so that at least one pulse of a pulse before the OLED starts the light emitting and a pulse at a first time when the OLED starts the light emitting has a width larger than a width of a pulse after the OLED starts the light emitting.

2. The OLED driving device according to claim 1, wherein the controller controls the OLED to start the light emitting at a first pulse of the PWM signal, wherein a width of the first pulse is set to be larger than the width of second and subsequent pulses.

3. The OLED driving device according to claim 1, wherein the overdrive comprises a plurality of overdrives, and in execution of repeat the overdrives, the controller sets the width of the at least one pulse being larger than the width of the pulse after the OLED starts the light emitting in the predetermined period for each of the overdrives.

* * * * *

UNITED STATES PATENT AND TRADEMARK OFFICE
CERTIFICATE OF CORRECTION

Page 1 of 1

PATENT NO. : 11,252,804 B2
APPLICATION NO. : 17/286695
DATED : February 15, 2022
INVENTOR(S) : Takagi It is certified that error appears in the above-identified patent and that said Letters Patent is hereby corrected as shown below:

In the Claims

Column 9, Line 10, delete "repeat" and add --repeating--

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*